United States Patent
Lee et al.

(10) Patent No.: US 10,707,251 B2
(45) Date of Patent: Jul. 7, 2020

(54) ARRAY SUBSTRATE FOR DIGITAL X-RAY DETECTOR, AND DIGITAL X-RAY DETECTOR INCLUDING THE SAME

(71) Applicant: LG Display Co., Ltd., Seoul (KR)

(72) Inventors: Hanseok Lee, Goyang-si (KR); Hyungil Na, Seoul (KR); Jungjune Kim, Seoul (KR); Seungyong Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/197,170

(22) Filed: Nov. 20, 2018

(65) Prior Publication Data

US 2019/0165008 A1    May 30, 2019

(30) Foreign Application Priority Data

Nov. 29, 2017   (KR) .................. 10-2017-0161300

(51) Int. Cl.
*H01L 27/146* (2006.01)
*G01T 1/208* (2006.01)
*H01L 31/0224* (2006.01)
*G01T 1/20* (2006.01)
*H01L 31/105* (2006.01)
*H01L 27/12* (2006.01)
*H01L 31/117* (2006.01)
(Continued)

(52) U.S. Cl.
CPC .......... *H01L 27/1462* (2013.01); *G01T 1/208* (2013.01); *G01T 1/2018* (2013.01); *H01L 27/1214* (2013.01); *H01L 27/1225* (2013.01); *H01L 27/14603* (2013.01); *H01L 27/14636* (2013.01); *H01L 27/14663* (2013.01); *H01L 31/0216* (2013.01); *H01L 31/02161* (2013.01); *H01L 31/02322* (2013.01); *H01L 31/022408* (2013.01); *H01L 31/022416* (2013.01); *H01L 31/105* (2013.01); *H01L 31/1055* (2013.01); *H01L 31/117* (2013.01); *H01L 27/14612* (2013.01)

(58) Field of Classification Search
CPC ........... H01L 27/1462; H01L 27/14603; H01L 27/14636; H01L 27/14663; H01L 31/022408; H01L 27/14612; G01T 1/2018; G01T 1/208
See application file for complete search history.

(56) References Cited

U.S. PATENT DOCUMENTS

| 9,690,971 | B2 * | 6/2017 | Liao ..................... G06K 9/0004 |
| 2011/0139994 | A1 * | 6/2011 | Lee ..................... H01L 31/0224 |
| | | | 250/370.09 |

(Continued)

*Primary Examiner* — Fernando L Toledo
*Assistant Examiner* — Neil R Prasad
(74) *Attorney, Agent, or Firm* — Fenwick & West LLP

(57) ABSTRACT

An array substrate for a digital X-ray detector and the digital X-ray detector including the same are disclosed. The array substrate effectively protects a PIN diode from external moisture or water, maximizes a light transmission region of a PIN diode, and reduces resistance by maximizing the region of a bias wiring. To this end, a closed-loop bias electrode formed to cover a circumferential surface of a PIN diode is used. In detail, the bias electrode includes a closed loop portion and a contact extension portion. The contact extension portion extends from one end of the closed loop portion so as to directly contact an upper electrode, and includes a hollow part therein.

12 Claims, 7 Drawing Sheets

(51) Int. Cl.
*H01L 31/0216* (2014.01)
*H01L 31/0232* (2014.01)

(56) References Cited

U.S. PATENT DOCUMENTS

2012/0153175 A1* 6/2012 Tredwell ........... H01L 27/14603
250/370.08
2014/0145252 A1* 5/2014 Kim .................. H01L 27/14658
257/292

* cited by examiner

ARRAY SUBSTRATE FOR DIGITAL X-RAY DETECTOR, AND DIGITAL X-RAY DETECTOR INCLUDING THE SAME

CROSS-REFERENCE TO RELATED APPLICATIONS

This application claims priority to Republic of Korea Patent Application No. 10-2017-0161300 filed on Nov. 29, 2017, in the Korean Intellectual Property Office, the disclosure of which is hereby incorporated by reference in its entirety.

BACKGROUND

1. Technical Field

The present disclosure relates to an array substrate for a digital X-ray detector, and a digital X-ray detector including the same.

2. Description of the Related Art

A digital X-ray detector (DXD) refers to an apparatus capable of detecting the transmission (e.g., transmissivity) of X-rays passing through a subject and displaying internal images of the subject on a display. With the rapid development of digital technology, a digital X-ray detector based on a thin film transistor (TFT) has recently been developed and rapidly come into medical use.

Generally, the digital X-ray detector is generally designed to have several thousand or tens of thousands of pixels or many more pixels according to the size or resolution thereof. Referring to FIGS. 1 and 2, each cell of the array substrate 10 for the digital X-ray detector may include a thin film transistor 20 disposed over a base substrate 11, a PIN diode 30 connected to the thin film transistor 20, and a scintillator 50 disposed over the array substrate 10.

When X-rays are emitted to the digital X-ray detector 1, the scintillator 50 converts the incident X-rays into visible light, such that the visible light is transmitted to the PIN diode 30 that includes a lower electrode 31, a PIN layer 33, and an upper electrode 35.

The visible light applied to the PIN diode 30 is re-converted into an electronic signal in the PIN layer 33. The electronic signal is converted into an image signal after passing through the thin film transistor 20 connected to the lower electrode 31 of the PIN diode 30, such that the resultant image signal is displayed on a display.

Meanwhile, in order to drive the PIN diode 30, a bias electrode 40 for applying a voltage to the PIN diode 30 may be connected to the PIN diode 30, and the bias electrode 40 may be disposed over the PIN diode 30 such that the bias electrode 40 is connected to the upper electrode 35 of the PIN diode 30.

In this case, it is preferable that the PIN diode 30 obtain a maximum light transmission region so as to receive the maximum amount of incident light from an upper part. To this end, the bias electrode 40 is generally patterned to occupy only a constant region of the upper part of the PIN diode 30.

However, the array substrate for the conventional digital X-ray detector has the following disadvantages.

First, since a PIN layer of the PIN diode is very vulnerable to external moisture or water, protecting the PIN layer from external moisture or water is of importance. However, the conventional structure has difficulty in preventing external moisture or water from penetrating the side of the PIN layer.

Although a protective layer formed to cover the PIN diode may serve as a part of a waterproof role, it is necessary for the protective layer to have a greater thickness or to be formed of a material appropriate for waterproofing such that the protective layer can effectively prevent water penetration. However, the overall thickness of the digital X-ray detector including the aforementioned protective layer unavoidably increases, or the scope for selecting constituent materials of the protective layer is greatly limited.

Second, the bias electrode extending from a bias line is connected to the upper electrode of the PIN diode, and the bias line is disposed to pass through some regions of the upper part of the PIN diode, such that the bias line partially covers the center part of the PIN diode, resulting in reduction of a light transmission region of the PIN diode.

Third, in order to acquire a maximum transmission region within the PIN diode, assuming that a thickness of the bias line is reduced to minimize the region of the PIN diode covered by the bias line such that the bias line is minimized in size, overall resistance of the bias line unavoidably increases.

SUMMARY

Therefore, the present disclosure has been made in view of the above problems, and it is an object of the present disclosure to provide an array substrate for a digital X-ray detector to effectively protect a PIN diode from external moisture or water, and the digital X-ray detector including the same.

It is another object of the present disclosure to provide an array substrate for a digital X-ray detector to maximize a light transmission region of a PIN diode, and the digital X-ray detector including the same.

It is another object of the present disclosure to provide an array substrate for a digital X-ray detector to reduce resistance by maximizing the region of a bias wiring, and a digital X-ray detector including the same.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

Various embodiments of the present disclosure are directed to providing an array substrate for a digital X-ray detector and the digital X-ray detector including the same that substantially obviate one or more problems due to limitations and disadvantages of the related art.

In accordance with one aspect of the present disclosure, an array substrate for a digital X-ray detector includes a base substrate, a thin film transistor disposed over the base substrate, a PIN diode formed to include a lower electrode connected to the thin film transistor, a PIN layer disposed over the lower electrode, and an upper electrode disposed over the PIN layer, a protective layer disposed over the PIN diode, and a bias electrode connected to the upper electrode while being disposed over the protective layer, and disposed to cover a circumferential surface of the PIN diode.

The bias electrode may be connected to the upper electrode through a contact hole of the protective layer formed at an edge of the upper electrode. The bias electrode may include a closed loop structure. The bias electrode may include a closed loop portion and a contact extension portion extending from one end of the closed loop portion. The contact extension portion may directly contact the upper electrode. The closed loop structure may include a hollow part therein.

In accordance with another aspect of the present disclosure, a digital X-ray detector includes an array substrate for the digital X-ray detector, and a scintillator disposed over the array substrate. The array substrate for the digital X-ray detector includes a base substrate, a plurality of gate lines and a plurality of data lines disposed to cross each other over the base substrate so as to define a plurality of pixel regions, a thin film transistor disposed in each of the pixel regions, a PIN diode, and a bias electrode.

The bias electrode may extend from plural bias lines that are disposed in parallel to the data lines while being spaced apart from the data lines. The bias lines may be arranged along one end of an edge of the PIN layer. Among the plurality of bias lines, bias electrodes extending from neighboring bias lines may not be connected to each other.

As described above, the embodiments of the present disclosure may arrange the bias electrode along a circumferential surface of the PIN diode, such that the bias electrode can prevent external moisture from penetrating the PIN layer of the PIN diode.

Specifically, the bias electrode is configured to have a closed loop in a manner that the bias electrode has a hollow part along an external edge of the PIN layer, resulting in a maximum light transmission region of the PIN diode. In addition, the overall region of the bias electrode is increased in size, resulting in reduction in overall resistance of the bias line.

DETAILED DESCRIPTION

Figure 1:
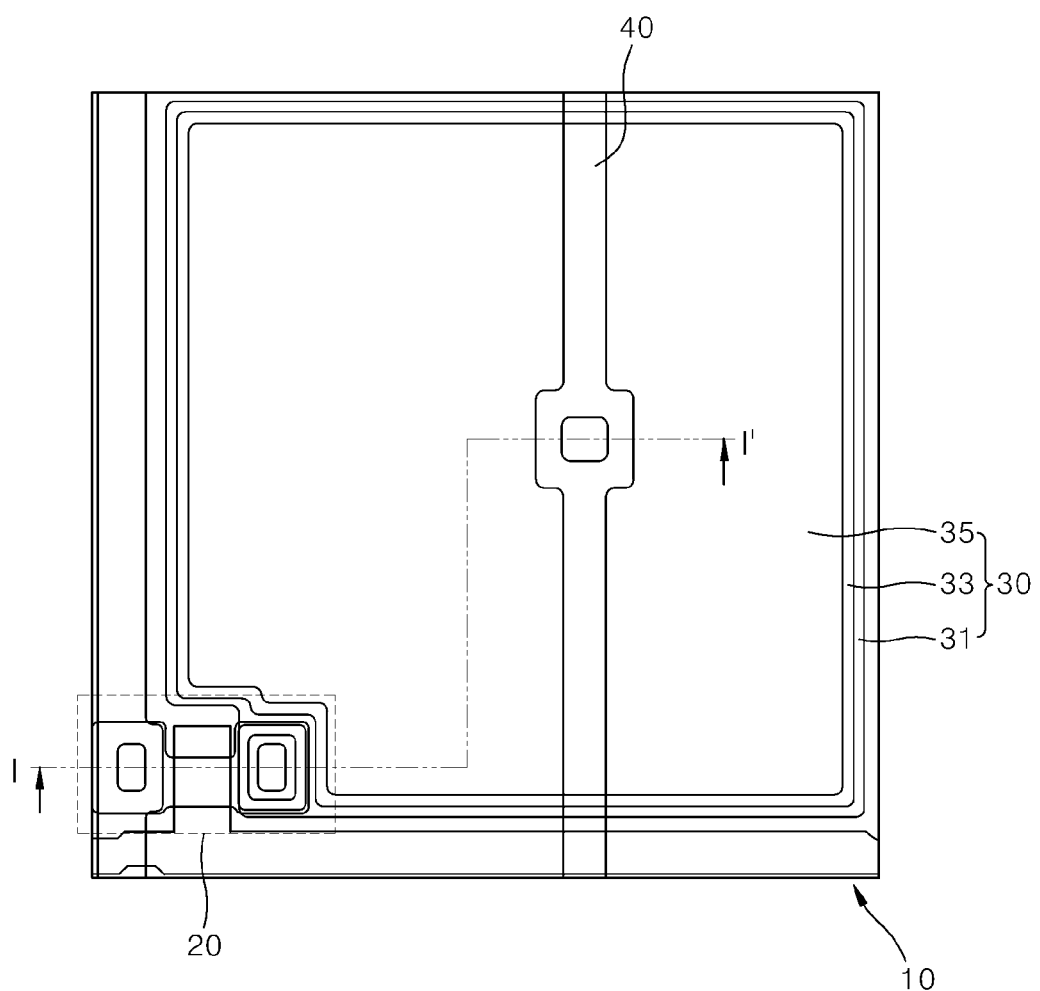
FIG. 1 is a plan view illustrating an array substrate corresponding to a single pixel region for use in a conventional digital X-ray detector.
Figure 2:
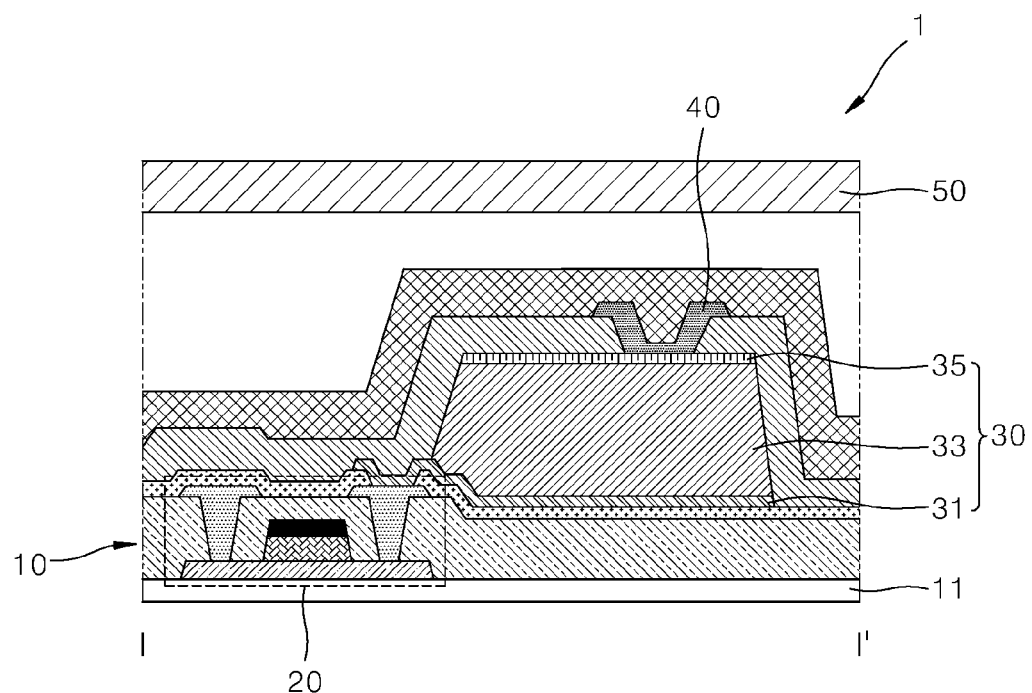
FIG. 2 is a cross-sectional view illustrating the array substrate taken along the line I-I' of FIG. 1 for use in the conventional digital X-ray detector.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that when one element is referred to as being "connected to", "coupled to", or "accessed by" another element, one element may be "connected to", "coupled to", or "accessed by" another element via a further element although one element may be directly connected to or directly accessed by another element.

Figure 3:
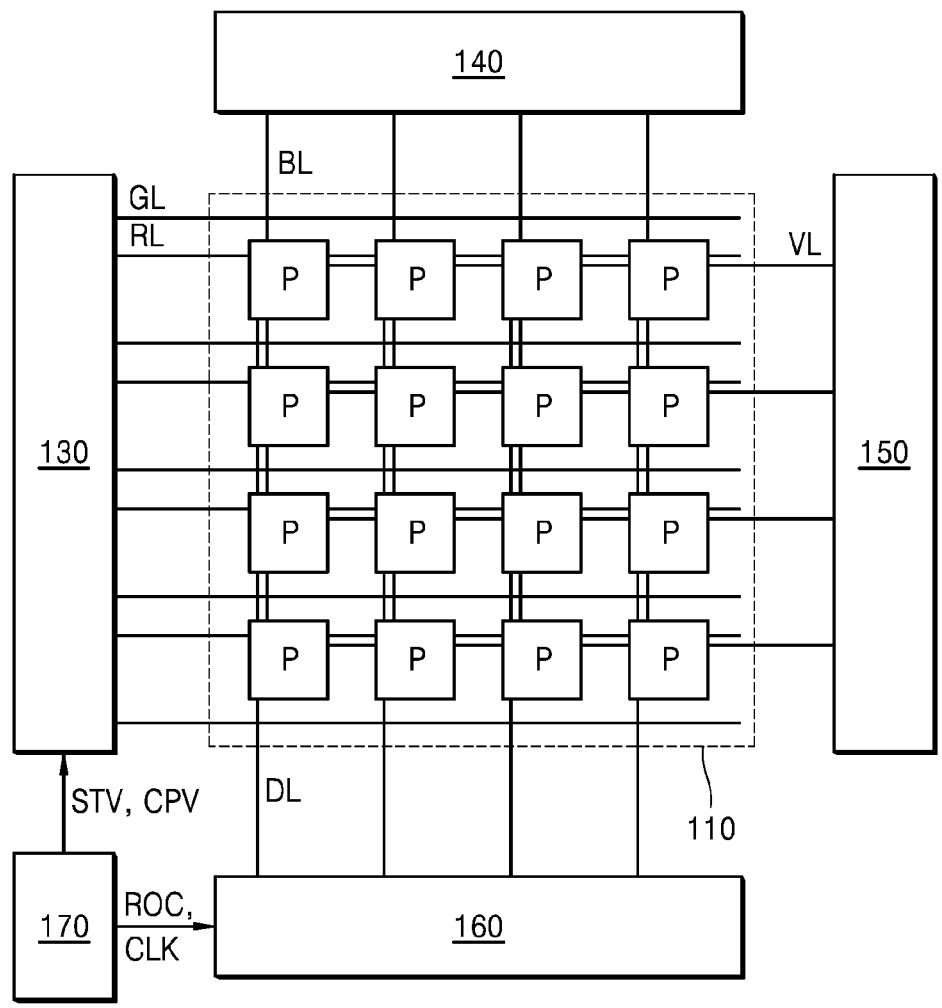
FIG. 3 is a schematic block diagram illustrating a digital X-ray detector according to an embodiment of the present disclosure.

FIG. 3 is a schematic plan view illustrating a digital X-ray detector, according to an embodiment of the present disclosure. Referring to FIG. 3, the digital X-ray detector may include a thin-film transistor (TFT) array 110, a gate driver 130, a bias supplier 140, a power-supply voltage supplier 150, a readout circuit 160, and a timing controller 170.

The TFT array 110 may sense X-rays emitted from an energy source, may perform photoelectric conversion of the sensed signal, and may thus output an electrical detection signal. In the TFT array 110, each cell region may be defined not only by a plurality of gate lines (GL) arranged in a horizontal direction, but also by a plurality of data lines (DL) arranged in a vertical direction perpendicular to the horizontal direction. Each cell region of the TFT array 110 may include a plurality of photosensitive pixels (P) arranged in a matrix.

Each photosensitive pixel (P) may include a PIN diode configured to sense light converted from X-rays and output the sensed light as a signal, and a thin film transistor (TFT) configured to transmit a detection signal output from the PIN diode in response to a gate signal. One side of the PIN diode may be connected to the thin film transistor (TFT), and the other side thereof may be connected to a bias line (BL).

A gate electrode of the thin film transistor (TFT) may be connected to the gate line (GL) through which a scan signal is transmitted, a source electrode may be connected to the PIN diode, and a drain electrode may be connected to the data line (DL) through which the detection signal is transmitted. The bias line BL may be arranged parallel to the data line (DL).

The gate driver 130 may sequentially apply a plurality of gate signals, each of which has a gate-ON voltage level, through the gate lines (GL). The gate driver 130 may also apply a plurality of reset signals, each of which has a gate-ON voltage level, through a plurality of reset lines (RL). Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 130 may be an integrated circuit (IC) such that the gate driver 130 may be populated on an external substrate connected to the TFT array 110 or may be formed over the TFT array 110 through a Gate In Panel (GIP) process.

The bias supplier 140 may apply a drive voltage through bias lines (BL). The bias supplier 140 may apply a predetermined voltage to the PIN diode. In this case, the bias supplier 140 may selectively apply a reverse bias or a forward bias to the PIN diode.

The power-supply voltage supplier 150 may supply a power-supply voltage to the photosensitive pixels through power-supply voltage lines (VL).

The readout circuit 160 may read out the detection signal generated from the thin film transistor (TFT) that is turned on in response to the gate signal. Accordingly, the detection signal generated from the PIN diode may be input to the readout circuit 160 through the data lines (DL).

The readout circuit 160 may include a signal detector, a multiplexer, etc. The signal detector may include a plurality of amplification circuits corresponding to the data lines (DL) on a one to one basis, and each amplification circuit may include an amplifier, a capacitor, a reset element, etc.

In order to control the gate driver 130, the timing controller 170 may generate a start signal (STV), a clock signal (CPV), etc., and may transmit the start signal (STV), the clock signal (CPV), etc. to the gate driver 130. In order to control the readout circuit 160, the timing controller 170 may generate a readout control signal (ROC), a readout clock signal (CLK), etc., and may transmit the readout control signal (ROC), the readout clock signal (CLK), etc. to the readout circuit 160.

Figure 4:
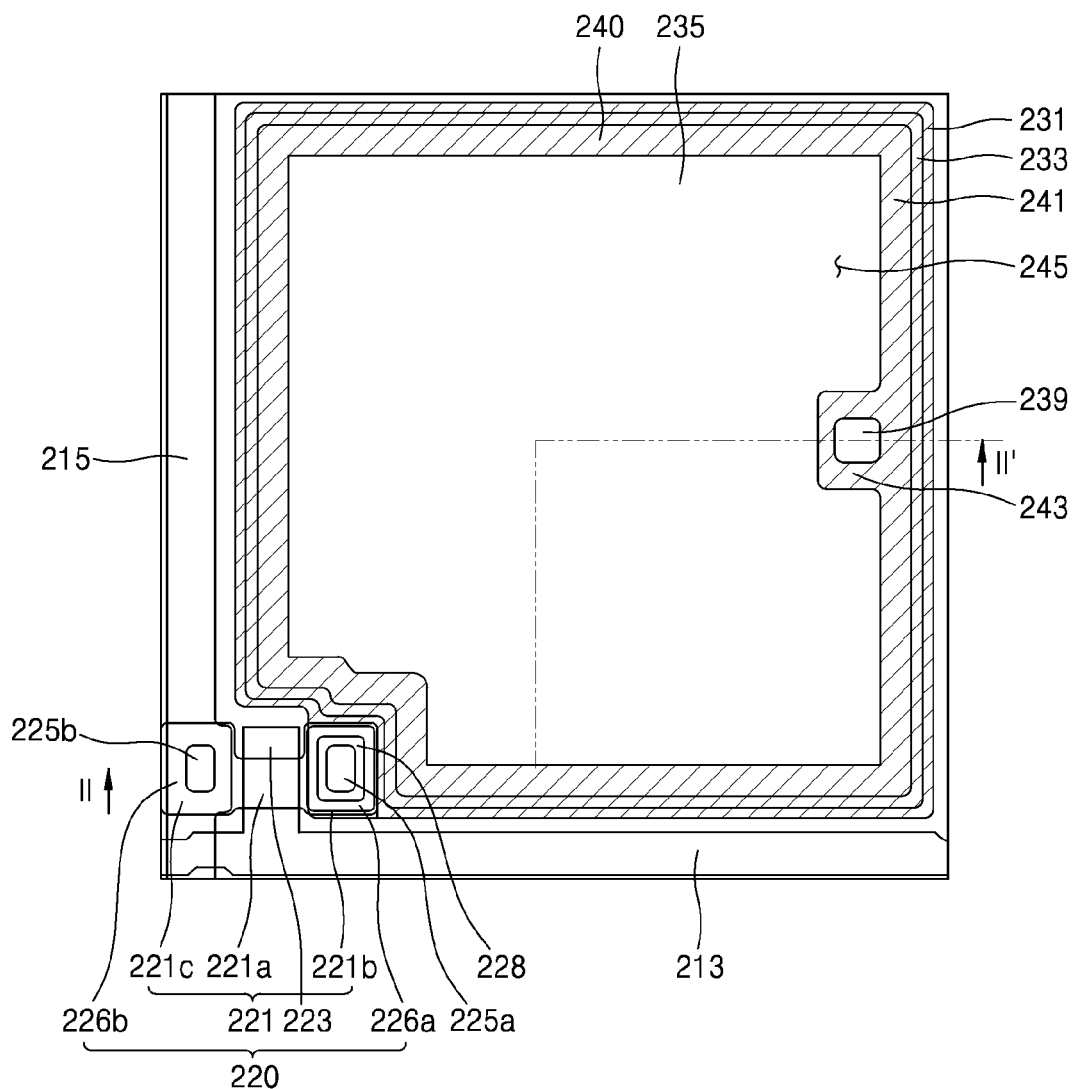
FIG. 4 is a plan view illustrating an array substrate corresponding to a single pixel region for use in a digital X-ray detector according to an embodiment of the present disclosure.
Figure 5:
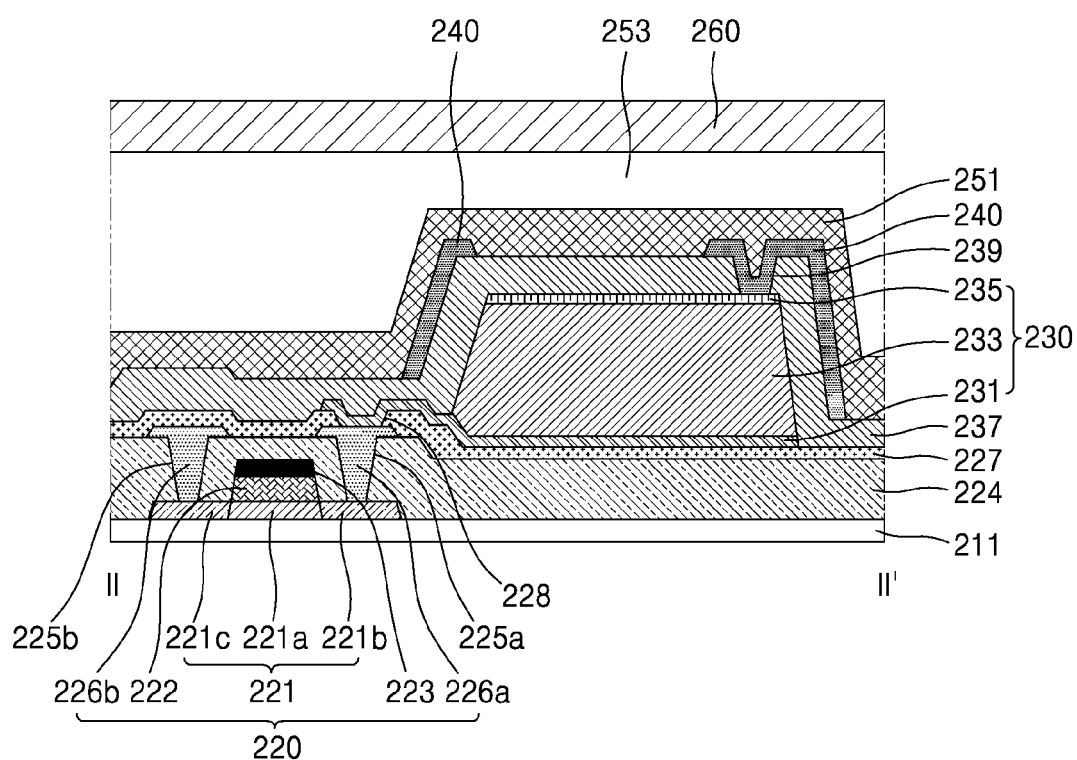
FIG. 5 is a cross-sectional view illustrating the array substrate taken along the line II-II' of FIG. 4 for use in a digital X-ray detector according to an embodiment of the present disclosure.

FIG. 4 is a plan view illustrating an array substrate corresponding to a single pixel region for use in a digital X-ray detector according to an embodiment of the present disclosure. FIG. 5 is a cross-sectional view illustrating the array substrate taken along the line II-II' of FIG. 4 for use in a digital X-ray detector according to an embodiment of the present disclosure.

The thin film transistor 220 may be disposed over the base substrate 211, and a buffer layer may be disposed between the base substrate 211 and the thin film transistor 220. The buffer layer may be a monolayer or multilayer structure formed of a silicon oxide (SiOx) film or a silicon nitride (SiNx) film.

The thin film transistor 220 may include an active layer 221, a gate insulation layer 222, a gate electrode 223, and first and second electrodes 226a and 226b.

Although the embodiment has disclosed for example that the active layer 221 is formed of an oxide semiconductor material for convenience of description, the scope or spirit of the present disclosure is not limited thereto, and the active layer 221 may also be formed of Low Temperature Polycrystalline Silicon (LTPS) or amorphous silicon (a-Si) without departing from the scope and spirit of the present disclosure. In this case, the oxide semiconductor material may be formed of an indium gallium zinc oxide (IGZO)-based material.

The active layer 221 may include a channel region 221a through which electrons move, and a source region 221b and a drain region 221c respectively formed at both ends of the channel region 221a. The source region 221b and the drain region 221c of the active layer 221 may be used as conductive regions, such that the source region 221b and the drain region 221c may respectively contact the first electrode 226a and the second electrode 226b. In this case, the first electrode 226a and the second electrode 226b may correspond to a source electrode and a drain electrode, respectively. However, the positions of the source region 221b and the drain region 221c may also be interchanged according to transistor types.

A gate insulation layer 222 may be disposed over the active layer 221. The gate insulation layer 222 may perform insulation between the active layer 221 and the gate electrode 223, and may be formed of a monolayer or multilayer structure formed of a silicon oxide (SiOx) film or silicon nitride (SiNx) film. The gate insulation layer 222 may be disposed to correspond to the channel region 221a of the active layer 221.

The gate electrode 223 extending from a gate line 213 so as to correspond to the channel region 221a of the active layer 221 may be disposed over the gate insulation layer 222. The gate electrode 223 may be formed of a monolayer or multilayer structure formed of a conductive material.

An interlayer insulation layer 224 may be formed over the gate electrode 223. The interlayer insulation layer 224 may be formed of the same material as the gate insulation layer 222. The interlayer insulation layer 224 may be formed across the entire surface of the base substrate 211, and may include a plurality of first contact holes 225a and 225b. The first electrode 226a may be electrically connected to the active layer 221 through a first contact hole 225a, and the second electrode 226b may be electrically connected to the active layer 221 through a first contact hole 225b.

The first electrode 226a and the second electrode 226b, each of which is formed of a conductive material, may be formed over the interlayer insulation layer 224. The first electrode 226a may be a source electrode that contacts the source region 221b of the active layer 221 through the first contact hole 225a. The second electrode 226b may be a drain electrode that contacts the drain region 221c of the active layer 221 through the first contact hole 225b.

Although the thin film transistor 220 according to the embodiment of the present disclosure is implemented as a coplanar structure for convenience of description, the scope or spirit of the present disclosure is not limited thereto, and the thin film transistor 220 may also be implemented as an inverted staggered TFT or a staggered TFT without departing from the scope and spirit of the present disclosure.

A first protective layer 227 may be disposed not only over the first electrode 226a, but also over the second electrode 226b. The first protective layer 227 may be formed across the entire surface of the base substrate 211. The first protective layer 227 may be formed of a monolayer or multilayer structure formed of a silicon oxide (SiOx) film or a silicon nitride (SiNx) film.

The lower electrode 231 of the PIN diode 230 may be disposed over the first protective layer 227, such that the lower electrode 231 may be connected to the first electrode 226a of the thin film transistor 220 through a second contact hole 228 of the first protective layer 227 formed to correspond to the first electrode 226a. The lower electrode 231 may be used as a pixel electrode of the thin film transistor 220. In addition, an additional pixel electrode separated from the lower electrode 231 of the PIN diode 230 may be used, such that the first electrode 226a of the thin film transistor 220 and the lower electrode 231 of the PIN diode 230 may also be connected to the additional pixel electrode as necessary. The lower electrode 231 may be formed of a non-transparent metal such as molybdenum (Mo) or a transparent oxide material such as indium tin oxide (ITO), indium zinc oxide (IZO), or zinc oxide (ZnO) according to characteristics of the PIN diode 230.

The PIN layer 233 in which an N-type (negative) semiconductor layer having N-type impurities, an intrinsic (I-type) semiconductor layer having no impurities, and a P-type (positive) semiconductor layer including P-type impurities are sequentially stacked, may be disposed over the lower electrode 231.

The intrinsic (I-type) semiconductor layer may be formed to have a greater thickness as compared to the N-type semiconductor layer and the P-type semiconductor. The PIN layer 233 may include a material capable of converting X-rays emitted from an energy source into an electric signal. For example, the PIN layer 233 may include amorphous selenium (a-Se), mercuric iodide ($HgI_2$), cadmium telluride (CdTe), lead oxide (PbO), lead iodide ($PbI_2$), bismuth tri-iodide ($BiI_3$), gallium arsenide (GaAs), germanium (Ge), and the like.

An upper electrode 235 may be disposed over the PIN layer 233 such that the PIN diode 230 is constructed together with the lower electrode 231 and the PIN layer 233. A second protective layer 237 formed to cover the PIN diode 230 and the thin film transistor 220 may be formed over the PIN diode 230. The upper electrode 235 may be formed of a transparent conductive material such as indium tin oxide (ITO), indium zinc oxide (IZO), or zinc oxide (ZnO) so as to increase light transmission efficiency of the scintillator 260 that receives X-rays and performs conversion of a wavelength of the X-rays.

A bias electrode 240, that is connected to the upper electrode 235 of the PIN diode 230 to cover a circumferential surface of the PIN diode 230, may be disposed over the second protective layer 237. The bias electrode 240 may be connected to the upper electrode 235 through a third contact hole 239 of the second protective layer 237 formed at one edge of the upper electrode 235.

As described above, the PIN layer 233 of the PIN diode 230 is very vulnerable to external moisture. Therefore, when external moisture enters the PIN layer 233, reliability of the PIN diode 230 is greatly reduced. The upper electrode 235 and the lower electrode 231 are respectively disposed at an upper part and a lower part of the PIN layer 233, such that the amount of water penetration about the PIN layer 233 can be significantly reduced. However, the side part of the PIN layer 233 does not include an additional metal protective layer such as the upper electrode 235 or the lower electrode 231, such that the side part of the PIN layer 233 is more vulnerable to external moisture or water.

Therefore, according to the embodiment of the present disclosure, the side part of the PIN layer 233, that is exposed outside without being covered by the upper electrode 235 or the lower electrode 231 so as to effectively prevent external moisture from penetrating the side part of the PIN layer 233, may be covered by the bias electrode 240. In this case, the bias electrode 240 may be disposed along the circumference of the PIN diode 230 so as to correspond to the side part of the PIN layer 233, and may also be disposed to cover not only the side part of the PIN layer 233 but also some portions of the upper edge of the PIN diode 230.

However, when the bias electrode 240 covers the upper edge of the PIN diode 230, a light transmission region of the PIN diode 230 can be reduced in size, and it is preferable that the region where the bias electrode 240 covers the upper edge of the PIN diode 230 be minimized in size.

In addition, the bias electrode 240 may be disposed along the circumferential surface of the PIN diode 230 without overlapping the thin film transistor 220, because parasitic capacitance may also occur when the bias electrode 240 is disposed to overlap the thin film transistor 220.

The bias electrode 240 may be formed of a non-transparent metal material such as molybdenum (Mo) or aluminum neodymium (AlNd).

In more detail, the bias electrode 240 may be formed in a closed loop as shown in FIG. 4. That is, the bias electrode 240 having the closed loop may enclose the circumferential surface of the PIN layer 233, such that the side part of the PIN layer 233 can be more effectively protected by the bias electrode 240 without being exposed outside.

The bias electrode 240 having the closed loop may include a closed loop portion 241 formed to enclose the circumferential surface of the PIN layer 233, and a contact extension portion 243 extending from one side of the closed loop portion 241. The contact extension portion 243 of the bias electrode 240 may be connected to the upper electrode 235 of the PIN diode 230 through the third contact hole 239 of the second protective layer 237. The contact extension portion 243 of the bias electrode 240 may be formed at one side of the bias electrode 240 formed along the bias line 248.

The closed loop structure may include a hollow part 245 therein, such that the hollow part 245 may allow the bias electrode 240 not to maximally reduce a light transmission region of the PIN diode 230. In more detail, the hollow part 245 having a maximally large size may be formed to prevent reduction of the light transmission region of the PIN diode 230. Therefore, the bias electrode 240 may cover the side part of the PIN layer 233 to be protected, and may not cover a maximum area of the upper part of the PIN diode 230.

A third protective layer 251 may be formed across the entire surface of the base substrate 211 at the bias electrode 240, and a scintillator 260 may be formed over the third protective layer 251, such that an X-ray detector is constructed. In this case, a planarization layer 253 formed of an organic material may be formed over the third protective layer 251, such that the scintillator 260 may be formed over the planarization layer 253. If necessary, the scintillator 260 may also be formed in a film shape and then attached to the planarization layer 253. Through a separate growth process, the scintillator 260 may also be formed over the third protective layer 251. The scintillator 260 may be formed of cesium iodide.

The above-mentioned X-ray detector may operate as follows.

X-rays emitted to the X-ray detector may be converted into visible light by the scintillator 260. The visible light may be converted into an electronic signal by the PIN layer 233 of the PIN diode 230. In more detail, when visible light is emitted to the PIN layer 233, the intrinsic semiconductor layer is depleted by the P-type semiconductor layer and the N-type semiconductor layer, and thus generates an electric field therein. Electrons and holes generated by light may be drifted by the electric field, and are then collected in the P-type semiconductor layer and in the N-type semiconductor layer, respectively.

The PIN diode 230 may convert visible light into an electronic signal, and may deliver the electronic signal to the thin film transistor 220. The delivered electronic signal may be displayed as an image signal after passing through the data line 215 connected to the thin film transistor 220.

Figure 6:
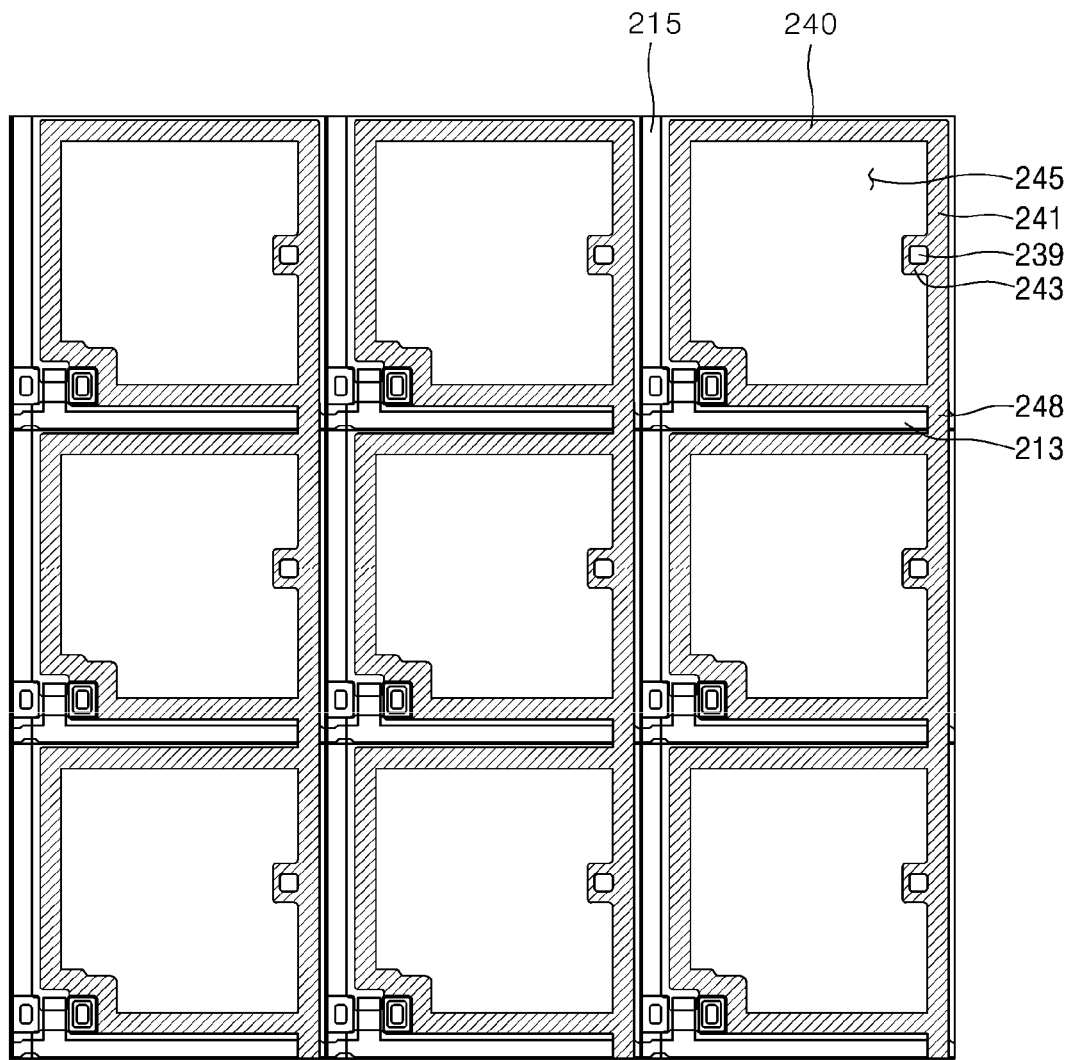
FIG. 6 is a plan view illustrating an array substrate corresponding to a plurality of pixel regions for use in a digital X-ray detector according to an embodiment of the present disclosure.

FIG. 6 is a plan view illustrating an array substrate corresponding to a plurality of pixel regions for use in a digital X-ray detector according to an embodiment of the present disclosure.

Referring to FIG. 6, a plurality of gate lines 213 arranged in a first direction and a plurality of data lines 215 arranged in a second direction perpendicular to the first direction may be disposed over the base substrate 211, such that a plurality of pixel regions may be formed. A plurality of bias lines 248 may be disposed in parallel to the plurality of data lines 215 while being spaced apart from the plurality of data lines 215.

In this case, a bias line 248 may be disposed along one side of the edge of the PIN diode 230. In more detail, the bias line 248 may be disposed at one side of the edge of the PIN diode 230 located farthest from the data line 215 with respect to a single pixel region.

The bias line 248 may pass through the plurality of pixel regions arranged in the direction of forming the bias line 248, and the closed-loop bias electrodes 240 extending from a single bias line 248 may be respectively connected to PIN diodes 230 of the individual pixel regions. Therefore, the plurality of bias electrodes 240 extending along the single bias line 248 may extend from the same bias line 248 such that the bias electrodes 240 may be electrically connected to each other.

Among the plurality of bias lines 248, the bias electrodes 240 extending from adjacent bias lines 248 may not be electrically connected to each other, and may be electrically isolated from each other, because the plurality of bias lines 248 is arranged in parallel while being spaced apart from each other without interconnection between adjacent bias lines 248.

The above-mentioned array substrate for the digital X-ray detector and the digital X-ray detector including the same according to the embodiments of the present disclosure have the following advantages and effects.

The closed-loop bias electrode may enclose the circumferential surface of the side of the PIN diode vulnerable to external moisture, and may minimize the amount of external moisture penetration, resulting in increased reliability of the PIN diode.

Specifically, a metal layer formed at the side of the PIN layer is formed of the bias electrode, such that external moisture can be prevented from penetrating the PIN layer without addition of a new process as compared to the conventional structure. In detail, as compared to the conventional PIN diode structure, the pattern of the bias electrode is changed to another pattern, such that only a pattern for the new patterning is needed and the PIN diode of the present disclosure can be formed by the same mask process as in the related art. As a result, reliability of the PIN diode can be increased without using an additional process.

In addition, the bias electrode includes a closed loop structure that has a hollow part therein while simultaneously enclosing the circumferential surface of the PIN layer of the PIN diode, such that reduction of the light transmission region of the PIN diode is minimized, resulting in increased light absorption ratio of the PIN diode.

Specifically, the bias line for interconnecting the plurality of closed-loop bias electrodes to guarantee a maximum light transmission region of the PIN diode may be disposed along one end of the edge of the PIN layer without being disposed at the center part of the PIN layer.

A contact extension portion of the bias electrode that is disposed over the PIN diode and is connected to the upper electrode may also be arranged along one end of the edge of the PIN layer of the PIN diode, such that a maximum light transmission region of the PIN diode can be guaranteed.

In addition, as the plurality of bias electrodes extending from a single bias line may enclose the PIN diode according to the closed loop structure, the entire region of the bias line is increased by the increasing length and region of the bias electrodes affected by the closed loop structure, such that resistance of the bias line can be greatly reduced.

According to the related art in which the bias line passes through the upper part of the PIN diode, the bias line is formed as thin as possible to guarantee a light transmission region of the PIN diode, resulting in increased resistance of the bias line. Therefore, guaranteeing the light transmission region and reducing resistance of the bias line are inversely proportional to each other.

In contrast, according to the embodiments of the present disclosure, as the region of the bias line can be increased in size and the light transmission region of the PIN diode can be guaranteed, the embodiments of the present disclosure can simultaneously obtain two effects.

In addition, the embodiments of the present disclosure can prevent external moisture from penetrating the PIN layer using the bias electrodes, such that constituent materials and thickness of the protective layer formed over the PIN diode capable of primarily preventing external moisture from penetrating the PIN layer can be more freely selected.

According to the related art, it is necessary for the protective layer to prevent external moisture from penetrating the PIN layer of the PIN diode, such that a material capable of preventing water penetration should be first considered in the process for increasing the thickness of the protective layer or selecting constituent materials of the protective layer. Specifically, when selecting a material having superior water penetration prevention characteristics as the constituent material of the protective layer only considering the protective role of the protective layer, characteristics of the thin film transistor or the PIN diode may be affected by the selected material, such that an unexpected additional problem may also occur in fabrication.

However, the embodiments of the present disclosure can prevent external moisture from penetrating the PIN layer using the bias electrode, such that a thickness of the protective layer can be minimized and the overall thickness and size of the digital X-ray detector can also be reduced. Even in the process for selecting constituent materials of the protective layer, the embodiments of the present disclosure can select not only a material for preventing water penetration but also various other materials as necessary.

Figure 7:
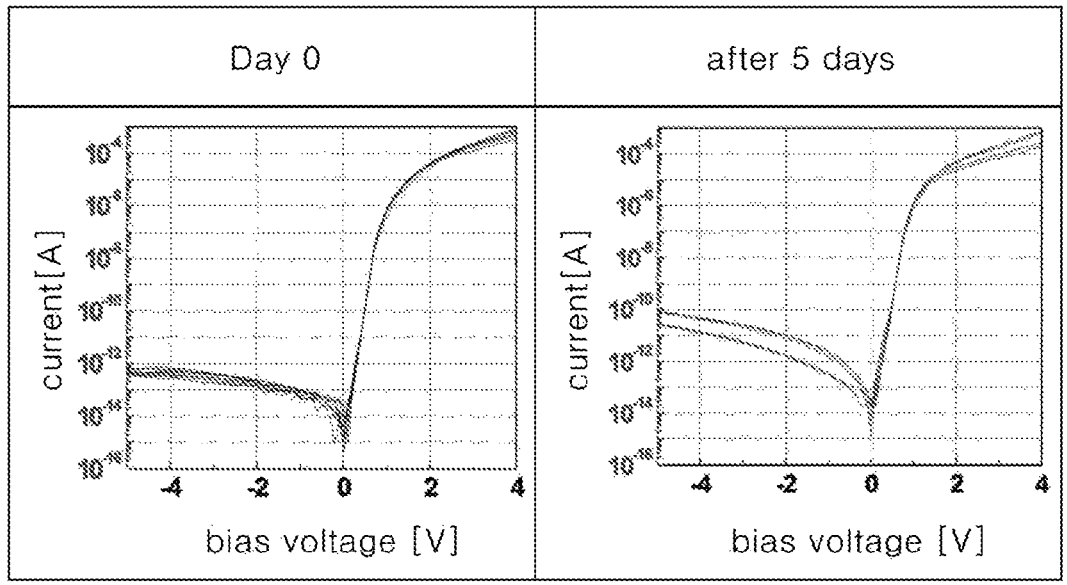
FIG. 7 illustrates results of measuring time-variant characteristics of a PIN diode for use in a conventional digital X-ray detector.
Figure 8:
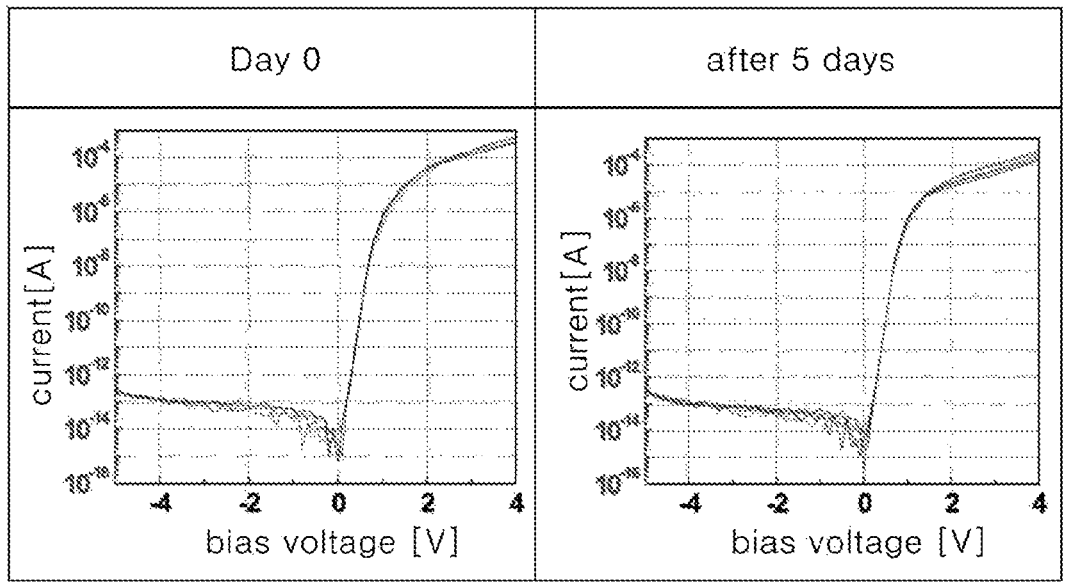
FIG. 8 illustrates results of measuring time-variant characteristics of a digital X-ray detector according to an embodiment of the present disclosure.

FIG. 7 illustrates results of measuring time-variant characteristics of a PIN diode for use in a conventional digital X-ray detector. FIG. 8 illustrates results of measuring time-variant characteristics of a digital X-ray detector according to an embodiment of the present disclosure. Referring to the measurement results shown in FIGS. 7 and 8, an array for a digital X-ray detector is formed to dispose 5 PIN diodes over a (370 mm×470 mm) glass substrate, and characteristics of the 5 PIN diodes are measured over time, such that the measurement graphs of FIGS. 7 and 8 can be obtained.

As can be seen from FIG. 7, according to the conventional structure shown in FIG. 1 in which the PIN layer of the PIN diode is not protected as a separate metal layer, after a span of 5 days in an initial off-current state, it can be confirmed that the off-current is greatly increased as compared to the initial off-current level, and distribution of the off-current is also distorted. In this way, if the off-current increases, uniformity of the PIN diode is deteriorated, such that characteristics of the overall panel are greatly deteriorated.

In contrast, as can be seen from FIG. 8, according to the PIN diode of the embodiments of the present disclosure, there is little difference between the off-current measurement value of the initial PIN diode and the off-current measurement value measured after a span of 5 days, and a constant current value with little increase over time can be obtained.

That is, when the side of the PIN layer is protected by the metal layer such as the bias electrode as described in the present disclosure, it can be confirmed that reliability of the PIN diode is increased without generating time-variant characteristics.

As is apparent from the above description, the embodiments of the present disclosure may allow the bias electrode to protect the PIN layer of the PIN diode vulnerable to external moisture, resulting in increased reliability of the PIN diode.

According to the embodiments of the present disclosure, the bias electrode has a closed loop structure by which the bias electrode is arranged along a circumferential surface of the PIN diode and includes a hollow part therein, such that a light transmission region of the PIN diode can be maximized in size, resulting in increased light absorption ratio.

In addition, a plurality of closed-loop bias electrodes may extend from a single bias line, such that the entire bias line region is increased in size, resulting in reduction of overall resistance of the bias line.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

What is claimed is:

1. An array substrate for a digital X-ray detector comprising:
    a base substrate;
    a thin film transistor disposed over the base substrate;
    a PIN diode including a lower electrode connected to the thin film transistor, a PIN layer disposed over the lower electrode, and an upper electrode disposed over the PIN layer;
    a protective layer disposed over the PIN diode; and
    a bias electrode connected to the upper electrode while being disposed over the protective layer, and disposed to cover a circumferential surface of the PIN diode.

2. The array substrate of claim 1, wherein the bias electrode is connected to the upper electrode through a contact hole of the protective layer formed at an edge of the upper electrode.

3. The array substrate of claim 1, wherein the bias electrode includes a closed loop structure.

4. The array substrate of claim 3, wherein:
    the bias electrode includes a closed loop portion and a contact extension portion extending from one end of the closed loop portion, wherein the contact extension portion directly contacts the upper electrode.

5. The array substrate of claim 3, wherein the closed loop structure includes a hollow part therein.

6. A digital X-ray detector comprising:
    an array substrate comprising:
        a base substrate,
        a plurality of gate lines and a plurality of data lines disposed to cross each other over the base substrate, so as to define a plurality of pixel regions,
        a thin film transistor disposed in each of the pixel regions,
        a PIN diode including a lower electrode connected to the thin film transistor, a PIN layer disposed over the lower electrode, and an upper electrode disposed over the PIN layer,
        a protective layer disposed over the PIN diode, and
        a bias electrode connected to the upper electrode while being disposed over the protective layer, and disposed to cover a circumferential surface of the PIN diode; and
    a scintillator disposed over the array substrate.

7. The digital X-ray detector of claim 6, wherein the bias electrode is connected to the upper electrode through a contact hole of the protective layer formed at an edge of the upper electrode.

8. The digital X-ray detector of claim 6, wherein the bias electrode includes a closed loop structure.

9. The digital X-ray detector of claim 8, wherein:
    the bias electrode includes a closed loop portion and a contact extension portion extending from one end of the closed loop portion, wherein the contact extension portion directly contacts the upper electrode.

10. The digital X-ray detector of claim 8, wherein the closed loop structure includes a hollow part therein.

11. The digital X-ray detector of claim 6, wherein the bias electrode extends from plural bias lines that are disposed in parallel to the data lines while being spaced apart from the data lines.

12. The digital X-ray detector of claim 11, wherein the bias lines are arranged along one end of an edge of the PIN layer.

* * * * *